(12) United States Patent
Dannoux et al.

(10) Patent No.: US 8,156,762 B2
(45) Date of Patent: *Apr. 17, 2012

(54) METHODS FOR MAKING MICROFLUIDIC DEVICES AND DEVICES PRODUCED THEREOF

(75) Inventors: Thierry Luc Alain Dannoux, Avon (FR); Paulo Gaspar Jorge Marques, Fontainebleau (FR); Robert Michael Morena, Lindley, NY (US); Cameron Wayne Tanner, Horseheads, NY (US)

(73) Assignee: Corning Incorporated, Corning, NY (US)

( * ) Notice: Subject to any disclaimer, the term of this patent is extended or adjusted under 35 U.S.C. 154(b) by 911 days.

This patent is subject to a terminal disclaimer.

(21) Appl. No.: 12/072,754

(22) Filed: Feb. 28, 2008

(65) Prior Publication Data

US 2008/0230951 A1 Sep. 25, 2008

(30) Foreign Application Priority Data

Feb. 28, 2007 (EP) .................................... 07300835

(51) Int. Cl.
*C03B 23/02* (2006.01)
*C03B 23/26* (2006.01)
(52) U.S. Cl. .......................................... 65/106; 65/102
(58) Field of Classification Search ................ 65/102, 65/106
See application file for complete search history.

(56) References Cited

U.S. PATENT DOCUMENTS

| 4,071,604 | A  | * | 1/1978  | Schwemer ............... 423/445 R |
| 5,013,348 | A  | * | 5/1991  | Hirota ............................ 65/102 |
| 5,171,347 | A  | * | 12/1992 | Monji et al. ...................... 65/64 |
| 5,213,600 | A  | * | 5/1993  | Greschner et al. ............. 65/102 |
| 6,079,228 | A  | * | 6/2000  | Tomisaka ........................ 65/102 |
| 6,301,931 | B1 | * | 10/2001 | Swierkowski et al. ........... 65/36 |
| 6,305,194 | B1 | * | 10/2001 | Budinski et al. ................. 65/105 |
| 6,769,444 | B2 |   | 8/2004  | Guzman et al. ............. 137/15.01 |
| 6,799,438 | B2 |   | 10/2004 | Herzbach et al. .............. 65/25.3 |
| 6,951,119 | B1 | * | 10/2005 | Quenzer et al. ................. 65/102 |
| 2003/0192587 | A1 |   | 10/2003 | Guzman et al. ............ 137/15.01 |
| 2004/0079114 | A1 | * | 4/2004  | Aitken et al. ..................... 65/64 |
| 2005/0239228 | A1 |   | 10/2005 | Quenzer et al. ................. 438/29 |
| 2005/0241815 | A1 |   | 11/2005 | Caze ............................ 165/170 |
| 2005/0276730 | A1 |   | 12/2005 | Dannoux et al. ............. 422/103 |
| 2006/0017194 | A1 | * | 1/2006  | Kuroda ......................... 264/219 |
| 2009/0162623 | A1 | * | 6/2009  | Foresti et al. ................. 428/210 |
| 2010/0237040 | A1 | * | 9/2010  | Kamata et al. .................. 216/22 |

FOREIGN PATENT DOCUMENTS

| WO | WO 03/086958 | 10/2003 |
| WO | WO2004085321 | 10/2004 |

OTHER PUBLICATIONS

English Language Machine Translation of JP 2003-275575 to Tokeshi accessed on PAJ Mar. 28, 2011.*
Patent Abstract of Japan, Pub 2003275575; Manabu; Nippon Sheet Glass Co Ltd; Institute of Microchemical Technology; Sep. 30, 2003.

(Continued)

*Primary Examiner* — Jason L. Lazorcik
(74) *Attorney, Agent, or Firm* — Gregory V. Bean

(57) ABSTRACT

Described herein are methods for making microfluidic devices comprising glass or glass-containing materials, wherein the methods have decreased cost and/or improved dimensional properties over similar formed glass articles produced using current techniques.

12 Claims, 6 Drawing Sheets

OTHER PUBLICATIONS

Patent Abstract of Japan, Pub 2001348243; Noboru; Mikami Junko; Dec. 18, 2001.
Patent Abstract of Japan, Pub 2002097030; Hideo; NTT Advanced Technology Corp.; Apr. 2, 2002.
Patent Abstract of Japan, Pub 2003020235; Koji; Otsuka Ohmi Ceramics Co., Ltd., Jan. 24, 2003.
P. Mertz, H.J. Quenzer, H. Bernt, B. Wagner and M. Zoberbier; A Novel Micromachining Technology for Structuring Borosilicate Glass Substrates; $12^{th}$ International conference on solid state sensors, actuators and Microsystems, Boston, Jun. 8-12, 2003.
M. Stjernstrom and J. Roeraade; "Method for fabrication of microfluidic systems in glass"; J. Micromech, Microeng. 8 (1998) pp. 33-38.

* cited by examiner

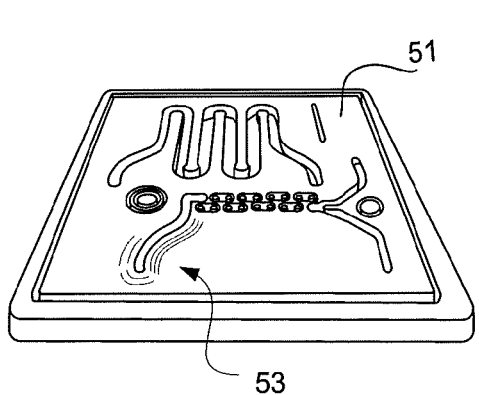
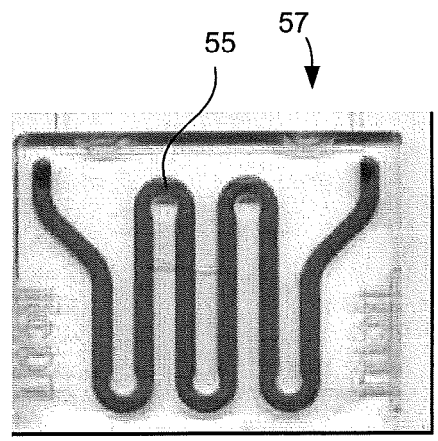
FIGURE 11
FIGURE 12
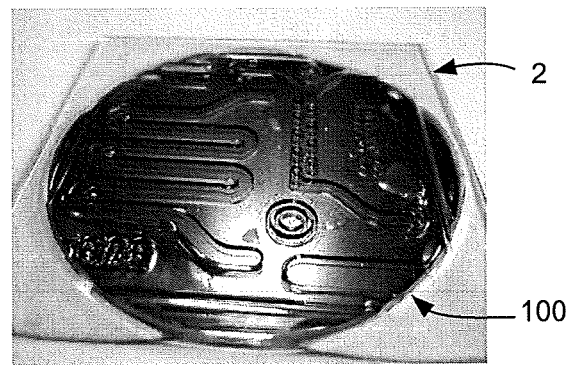
FIGURE 13

METHODS FOR MAKING MICROFLUIDIC DEVICES AND DEVICES PRODUCED THEREOF

BACKGROUND

Microfluidic devices as herein understood are devices containing fluidic passages or chambers having typically at least one and generally more dimensions in the sub-millimeter to millimeters range. Partly because of their characteristically low total process fluid volumes and characteristically high surface to volume ratios, microfluidic devices can be useful to perform difficult, dangerous, or even otherwise impossible chemical reactions and processes in a safe, efficient, and environmentally-friendly way, and at throughput rates that are on the order of 100 ml/minute of continuous flow and can be significantly higher.

Microfluidic devices have been made of various materials including metals, ceramics, silicon, and polymers. The shortcomings encountered with these materials are numerous.

For example, devices made of polymers typically cannot withstand temperatures of more than 200° C. to 300° C. over a prolonged period. Moreover, it is often difficult to control surface states effectively within such structures.

Silicon devices are expensive and incompatible with certain chemical or biological fluids. Further, the semiconductive nature of silicon gives rise to problems with implementing certain pumping techniques, such as electro-hydrodynamic pumping and electro-osmotic pumping. Still further, the lithographic techniques used in forming silicon microfluidic devices naturally produce small channels (typically less than 100 µm). Such small channels have high backpressures and have difficulty achieving production throughput requirements.

Devices made of metal are liable to corrode and are typically not compatible with certain chemical or biological fluids.

It is therefore desirable, in numerous contexts, to have microfluidic structures made of glass, or at least having reaction channels lined with glass.

Microfluidic devices made of glass have been obtained by chemical or physical etching. Etching may be used to produce trenches in a glass substrate which trenches may be sealed by a glass lid, for example. Such techniques are not entirely satisfactory, however. Isotropic chemical etching does not enable significant aspect ratios to be obtained, while physical etching is difficult to implement due to its high cost and limited production capacity. To close the open trenches, the technique most often employed to attach or seal a lid is ionic attachment. This technique, however, is expensive and difficult to implement insofar as it is highly sensitive to dust. Moreover, the surface of each layer must be extremely flat in order to provide high quality sealing.

Microfluidic devices formed of structured consolidated frit defining recesses or passages between two or more substrates have been developed in previous work by the present inventors and/or their associates, as disclosed for example in U.S. Pat. No. 6,769,444, "Microfluidic Device and Manufacture Thereof" and related patents or patent publications. Methods disclosed therein include various steps including providing a first substrate, providing a second substrate, forming a first frit structure on a facing surface of said first substrate, forming a second frit structure on a facing surface of said second substrate, and consolidating said first substrate and said second substrate and said first and second frit structures together, with facing surfaces toward each other, so as to form one or more consolidated-frit-defined recesses or passages between said first and second substrates. In devices of this type, because the consolidated frit defines the fluidic passages, the passages can be lined with the glass or glass-ceramic material of the consolidated frit, even if a non-glass substrate is used.

Another approach to making glass microfluidic devices, disclosed for example in International Patent Publication WO 03/086958 involves vapor deposition of the glass on a surface of a temporary substrate that is shaped to serve as a negative mold for the shape to be produced. After glass is formed on the surface by vapor deposition, the temporary substrate is removed from the glass by wet etching. Vapor deposition and etching are relatively slow, expensive and environmentally unfriendly processes.

The present inventors and/or their associates have developed a method of forming a microfluidic device in which a thin sheet of glass is vacuum-formed resulting in an alternating channel structure on opposing sides of the sheet, then closed by fusing with one or more other vacuum-formed or flat sheets, as shown for example in US Patent Publication 2005/0241815. While the method therein disclosed is useful for the purposes described therein, it is desirable to be able to form even finer and more complex structures than is possible with this vacuum-forming technique, including sharp groove angles (e.g., 90°) and a larger variety of channel shapes and sizes.

SUMMARY

Described herein are methods of producing microfluidic devices. The advantages of the materials, methods, and devices described herein will be set forth-in part in the description which follows, or may be learned by practice of the aspects described below. The advantages described below will be realized and attained by means of the elements and combinations particularly pointed out in the appended claims.

BRIEF DESCRIPTION OF FIGURES

FIG. 11 is a perspective view of a formed glass sheet.

FIG. 12 is a photograph of a sample microfluidic device assembled by pressing two formed glass sheets together, where the grey channels are open recesses in the device.

FIG. 13 shows a photograph of formed glass sheet pressed and fused onto a silicon wafer.

DETAILED DESCRIPTION

Figure 1:
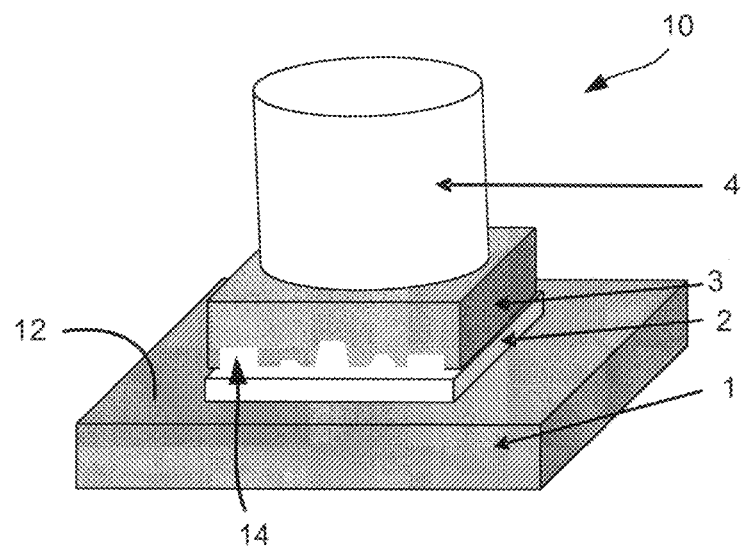
FIG. 1 shows stacked system for forming a composition comprising a glass into a formed article.

In this specification and in the claims that follow, reference will be made to a number of terms that shall be defined to have the following meanings:

Throughout this specification, unless the context requires otherwise, the word "comprise," or variations such as "comprises" or "comprising," will be understood to imply the inclusion of a stated feature or step or group of features or steps but not the exclusion of any other feature or step or group of features or steps.

It must be noted that, as used in the specification and the appended claims, the singular forms "a," "an" and "the" include plural referents unless the context clearly dictates otherwise. Thus, for example, reference to "a glass material" includes mixtures of two or more such materials, and the like.

In one aspect, the method for making a glass-containing microfluidic device comprises:

providing a piece of rigid, non-stick material having a patterned molding surface;

providing a first amount of glass-containing material;

contacting the first amount of glass-containing material with the patterned molding surface;

pressing the patterned molding surface and the first amount of glass-containing material together;

heating the piece of rigid non-stick material and the first amount of glass-containing material together sufficiently to soften the amount glass-containing material such that the patterned molding surface is replicated in the first amount of glass-containing material, the first amount of glass-containing material forming a first formed glass-containing article;

stacking the first formed glass-containing article with at least two additional glass-containing articles;

sealing the stacked articles together by heat treatment to create a microfluidic device having at least one fluidic passage therethrough.

The glass-containing material useful herein is any glass-containing material that upon heating can be converted to a viscous material. The glass-containing material may be in the form of a frit, including a filled frit. The glass-containing material may also be in the form of a sheet. The dimensions of the sheet can vary from few hundred square microns up to several decimeters square and have sheet thicknesses from several hundred micrometers up to several centimeters. The glass containing material may comprise vitreous glass, glass ceramic, or a glass composite.

The glass composite may comprise a glass frit and a filler. The composite may be prepared, in frit form, by intimately admixing a glass frit and a filler. The resulting frit composite or filled frit may then be used directly as the glass-containing material, in the forming methods of the present invention, or it may first be formed into a glass sheet. In either case, it is desirable that the filler is evenly dispersed or integrated throughout the composite. This helps ensure that the entire glass sheet has reasonably consistent properties (e.g., average thermal conductivity) throughout the entire sheet. Certain glass frit and filler materials useful herein will be described below.

The glass frit is any glass material that upon heating can be converted to a viscous material. A variety of materials can be used herein. In one aspect, the glass frit comprises $SiO_2$ and at least one other alkaline oxide, alkaline earth oxide, a transition metal oxide, a non-metal oxide (e.g., oxides of aluminum or phosphorous), or a combination thereof. In another aspect, the glass frit comprises an alkaline silicate, an alkaline earth silicate, or a combination thereof. Examples of materials useful as glass frits include, but are not limited to, a borosilicate, zirconium-containing borosilicate, or sodium borosilicate.

Turning to the filler, the filler is desirably nearly or completely inert with respect to the glass frit in order to preserve the thermal and mechanical properties of the filler. When the filler is nearly or completely inert with respect to the glass frit, the filler has no or minimal reaction within the filler/frit matrix such that there is essentially no foaming, forming of new phases, cracking and any other processes interfering with consolidation. Under these conditions, it is possible to produce a composite with minimal porosity.

The filler is also generally desirably non-porous or has minimal porosity and possesses low surface area. The filler does not burn out during sintering like organic compounds typically used in the art. The filler can remain rigid, soften, or even melt during thermal processing. In one aspect, the filler has a softening or melting point greater than that of the glass frit. Depending upon the selection of the filler, the filler can form an oxide, which will facilitate its integration into the final composite.

The filler desirably increases the average thermal conductivity of the composite. In one aspect, the filler has an average thermal conductivity greater than or equal to 2 W/m/K, greater than or equal to 3 W/m/K, greater than or equal to 4 W/m/K, or greater than or equal to 5 W/m/K. Examples of fillers useful herein include, but are not limited to, silicon carbide, aluminum nitride, boron carbide, boron nitride, titanium bromide, mullite, alumina, silver, gold, molybdenum, tungsten, carbon, silicon, diamond, nickel, platinum, or any combination thereof.

The amount of filler can vary depending upon, among other things, the type of glass frit selected and the desired average thermal conductivity. In one aspect, the amount of filler is greater than or equal to 5% by volume of the composite. In another aspect, the amount of filler is from 15% to 60% by volume of the composite.

With respect to the material used to make the mold, the porosity and chemical stability of the mold are to be considered in addition to the CTE/Young's modulus of the mold material relative to the glass. With respect to porosity, the mold most desirably possesses a certain degree of porosity so that gases produced during thermal processing can escape the molten glass through the porous mold and not be entrapped in the glass. In one aspect, the mold has an open porosity greater than 5%, that is, greater than 5% of the volume of the mold is open. In another aspect, the mold has a porosity of at least 10%.

Another consideration when selecting the mold material is that the mold should be chemically stable at elevated temperatures, particularly those required to convert the glass sheet to molten glass. The term "chemically stable" as used herein with respect to the mold material is defined as the resistance of the mold material to be converted from an inert material to a material that can interact with the molten glass. For example, while boron nitride could be used, boron nitride can be converted to boron oxide at temperatures greater than 700° C. Boron oxide can chemically interact with glass, which results in the glass sticking to the mold. Thus according to one aspect of the present invention, boron nitride may be used but is not preferred.

More desirably, the mold material comprises carbon, most desirably porous carbon such as grade 2450 PT graphite manufactured by Carbone Lorraine. This grade of graphite has a CTE of $25 \times 10^{-7}/°$ C. at 300° C. and open porosity level of about 10%. Techniques such as CNC machining, diamond ultra high speed machining, electro discharge machining, or a combination thereof can be used to make specific molding surfaces. The molding surface design can vary depending upon the desired features. As will be discussed in detail below, the methods described herein permit the use of molding surfaces with high aspect ratios (height/width greater than 3) and absolute heights from few microns up to several millimeters. Absolute heights and aspect ratios are not restricted to single values and can vary from one area of the molding surface to another. The molding surface can possess a variety of different three-dimensional (3D) grooved structures (e.g., channels, cavities) and raised structures (e.g., walls, pillars), which are desirable in microfluidic devices. Moreover, a release angle of 90° is possible with the grooved or raised structures on the mold, the relevance of which will be described in more detail below.

One embodiment for producing formed glass-containing articles will now be described with reference to FIG. 1. A first amount of a glass-containing composition, in the form of a sheet 2 in this case, is disposed between a first surface, such as a flat upper surface 12 of a first structure 1 and a second, patterned surface, such as a molding surface 14, of a second structure 3. If the glass-containing composition is in the form of a sheet 2, it is generally desirable that the sheet 2 have a high degree of planarity. The first surface 12 and the second or molding surface 14 can be composed of the same or different materials. In one aspect, the first surface 12 comprises carbon, a boron nitride ceramic, or a combination thereof. In another aspect, when the first surface 12 and the second surface 14 are composed of the same material, the material is carbon, desirably porous carbon, such as grade 2450 PT graphite manufactured by Carbone Lorraine.

A release agent may optionally be used. The release agent can be applied to any of the second surface 14, the glass-containing composition 2, and the first surface 12 as desired. The amount of release agent that may be applied can vary. It is desirable that the material of the second surface 14 and release agent have similar properties or that they are composed of similar materials. For example, when the second surface or molding surface 14 is composed of graphite, the release agent is desirably carbon soot.

Pressure is desirably applied to the interface between the glass-containing composition 2 and the second surface 14. This may be achieved by a load 4 placed on top of the second structure 3 to facilitate penetration of the second surface or molding surface 14 into the glass-containing composition 2 during heating. The first structure 1, the glass-containing composition 2, the second structure 3 and the load 4 together form a stacked system 10. The load can be prepared from any material that can withstand elevated temperatures (i.e., temperatures required to adequately soften the glass-containing composition 2). The weight of the load can vary depending upon the amount or thickness of the glass-containing composition 2 and the desired amount of penetration of the second surface or molding surface 14 into the composition.

Once the stacked system 10 composed of the first structure, the glass-containing composition, the second structure, and the optional load is prepared, the stacked system 10 is heated to a temperature sufficient to result in viscous flow of the glass-containing composition 2. To perform this heating, the stacked system 10 can be placed in an oven. Prior to heating, air in the oven is desirably removed by vacuum, and an inert gas such as nitrogen is introduced into the oven. It is contemplated that one or more stacked systems can be introduced into the oven.

Figure 2:
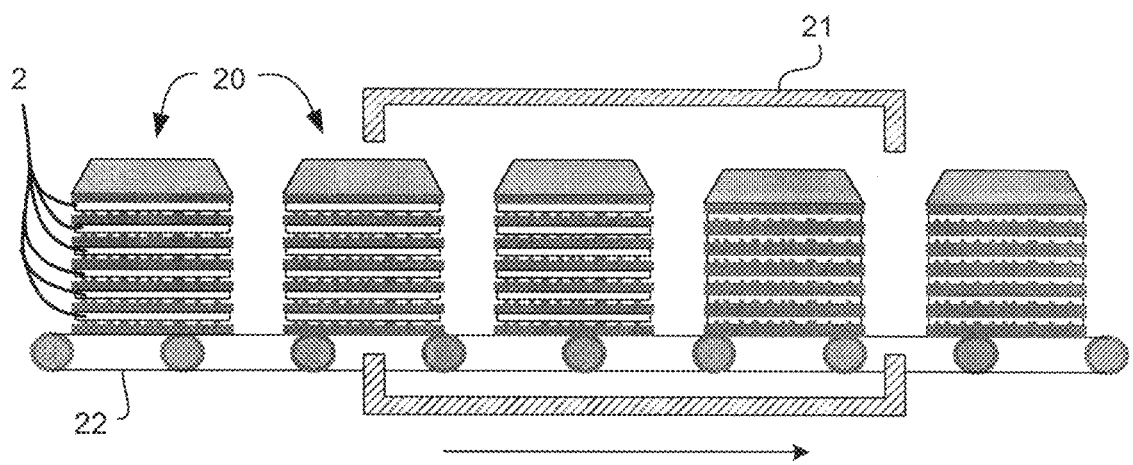
FIG. 2 shows multiple stacked systems being processed through an oven via a conveyor belt.

A series of stacked systems can be introduced into the oven by way of a conveyor belt, and the stacked systems can include more than one amount of glass-containing composition. This aspect is depicted in FIG. 2, where a series of stacked systems 20 are fed into the oven 21 under an atmosphere of nitrogen gas by a conveyor belt 22, and where each stacked system 20 includes six amounts 2 of the glass-containing composition. The rate at which the stacked systems 20 are transitioned into the oven can vary from one minute to one hour. The process depicted in FIG. 2 is an efficient method for producing a large number of formed articles from the multiple starting amounts 2 of the glass-containing compositions. For example, if stacked systems composed of amounts 2 are fed into the oven at 5 meters/hr for a two hour thermal cycle, and the oven is 12 m long, the oven can thermally process 60 stacked systems per hour, which corresponds to 600 formed articles produced in one hour.

Figure 3:
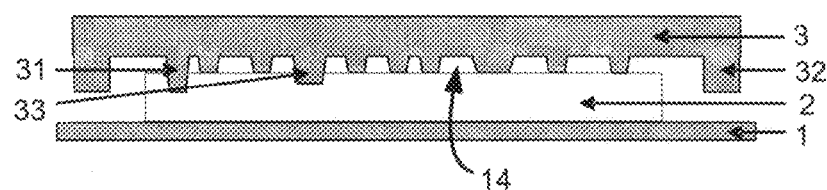
FIG. 3 shows the cross-section of a composition comprising glass disposed between the surfaces of first and second structures thermal processing.
Figure 4:
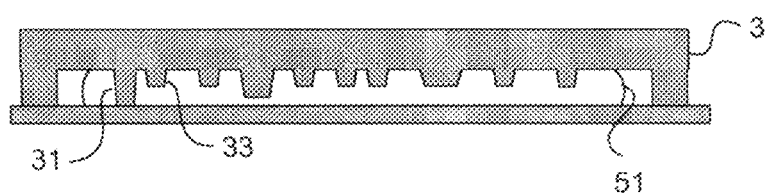
FIG. 4 shows the cross-section of a composition comprising a glass disposed between first and second structures, where a surface of one of the structures has penetrated the composition.
Figure 5:
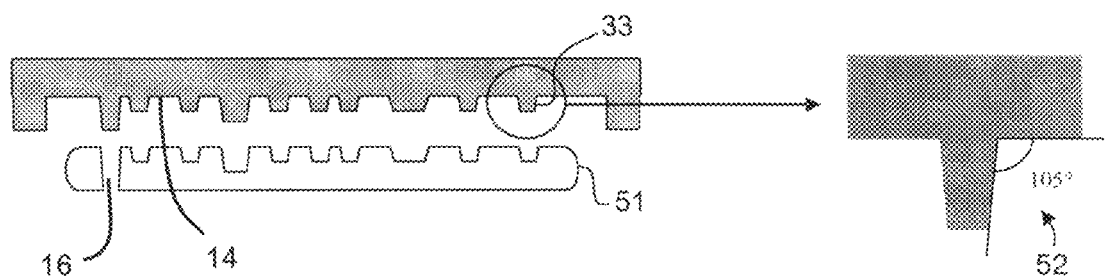
FIG. 5 shows the cross-section of a formed glass-containing composition removed from the molding surface and a release angle of a mold impression.

FIG. 3 shows a cross-sectional view of a stacked system 10 without the load. With respect to second structure 3, the second surface or molding surface 14 can have one or more areas or features 31 of the surface 14 that contact the first surface of the first structure when forming is complete, as shown in FIG. 4. The area or feature 31, in the form of an area spaced apart from the perimeter of the second or patterned surface 14 in this case, is offset enough from the majority of the surface 14 in the vertical direction in the Figures such that it can penetrate the glass-containing composition 2 upon thermal processing, and produce a through-hole 16 in the formed article 51, as shown in FIG. 5. The shape of the area 31 can be any shape such as round, rectangular, or oblong. The formation of through-holes during thermal processing avoids hole-drilling in the formed article, which can be expensive and damage or destroy the article. As another optional feature of its patterned second surface or molding surface 14, the second structure 3 also has a another area that contact the first surface 12 of the first structure when forming is complete, area 32 at the perimeter of the patterned second surface 14, and optionally surrounding the patterned second surface 14 of the second structure 3. Such are surrounding raised area can act as a flow retainer to prevent molten glass from escaping from between the structures 1 and 3. Such a flow retainer can also help ensure uniform thickness and homogeneity of the glass during processing.

As shown in FIG. 3, a plurality of raised areas 33 are on surface 14 of structure 3, which ultimately produce the formed features in the glass-containing composition. Referring to FIG. 4, upon heating, the glass-containing composition is converted to a softened or viscous state, at which time the area 31 and areas 33 penetrate the glass-containing composition. FIG. 5 shows the formed article 51 after processing and removal from the surface 14.

The temperature and duration of thermal processing of the stacked system 10 or 20 can vary among several parameters including, but not limited to, the viscosity of the glass-containing composition, the aspect ratio of the surface 14, and the complexity of the surface 14. Typical techniques for making glass molding surfaces are limited to short heating times in order to avoid sticking of the molten glass to the surface. This results in the formation of simple molding surfaces. The methods described herein avoid sticking of the molten glass to the molding surface during processing. Thus, longer heating times are possible with the methods described herein, which permit the softened glass-containing composition to penetrate each opening of an intricate molding surface. This ultimately results in the formation of more intricate formed glass-containing articles. Thus, the stacked system can be heated from one minute to one hour, which is a much broader range than current hot forming techniques.

After the heating step, the stacked system is allowed to slowly cool down to at least 100° C., and desirably all the way to room temperature over time. The methods described herein not only prevent the softened glass-containing composition from sticking to the molding surface or surfaces, the methods described herein permit slow cooling of the glass-containing composition and the molding surface together, without the glass freezing (i.e., sticking) to the molding surface. By cooling slowly, the formation of cracks in the second structure and the molding surface can be prevented, such that the second structure and its molding surface may be re-used. Moreover, because the molding surface does not stick to the formed article, the second structure and its molding surface can be removed from the formed article by hand, and not by techniques commonly used in the art such as etching. This has a dramatic effect on production cost and the overall quality of the formed article.

As described above, the methods described herein permit the production of formed glass-containing articles with intricate and detailed features. For example, the molding surface can possess a plurality of areas that can penetrate the glass-containing composition at a depth of greater than 100 µm and a width greater than 100 µm. In another aspect, the depth can be from of 100 µm to 10 mm and the widths can be from 100 µm to 10 mm. In another aspect, the molding surface has an aspect ratio greater than three, where the aspect ratio is the height of the area or feature of the surface 14 (in the vertical direction in the Figures) over the width of the area or feature. Referring to FIG. 5, a release angle 52, in one experiment was 105°. Release angles of exactly 90° are generally not possible using previously known techniques due to the glass-containing composition sticking to the molding surface. But because the methods described herein avoid sticking between the glass-containing composition and the molding surface, release angles close to 90° are possible. Moreover, high aspect ratios coupled with release angles approaching 90° are also possible. Once again, because the softened glass-containing composition does not stick to the molding surface, longer heating times are possible, which results in increased aspect ratios and in release angles approaching 90°. This can be desirable in certain applications such as microfluidic devices.

Figure 6:
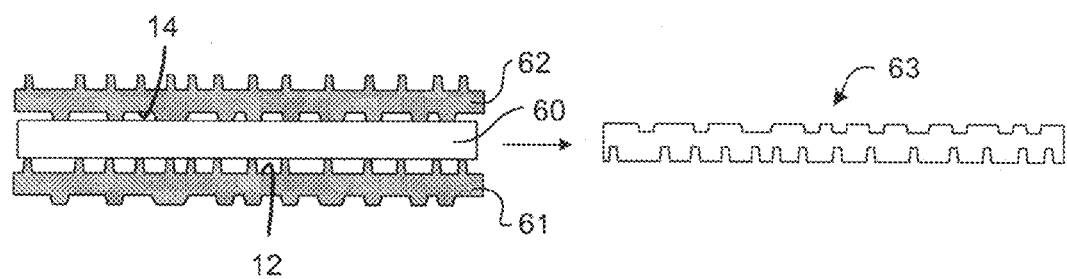
FIG. 6 shows the cross-section of an amount of a glass-containing composition disposed between two different molding surfaces to produce a formed article with mold impressions on both sides.

Although the first surface 12 of the first structure in FIG. 1 is planar, first surface 12 alternatively can also be a patterned surface. Referring to FIG. 6, glass-containing composition 60 is inserted between the first structure 61 and the second structure 62. In this aspect, first and second surface 12 and 14 of first and second structures 61 and 62 are both patterned, and are different with respect to the number and dimensions of raised areas. After thermal processing, a formed glass-containing article 63 is produced where each side of the article has molding-surface impressions. Thus, it is possible to have the same or different impressions on each side of the formed glass-containing article.

Figure 7:
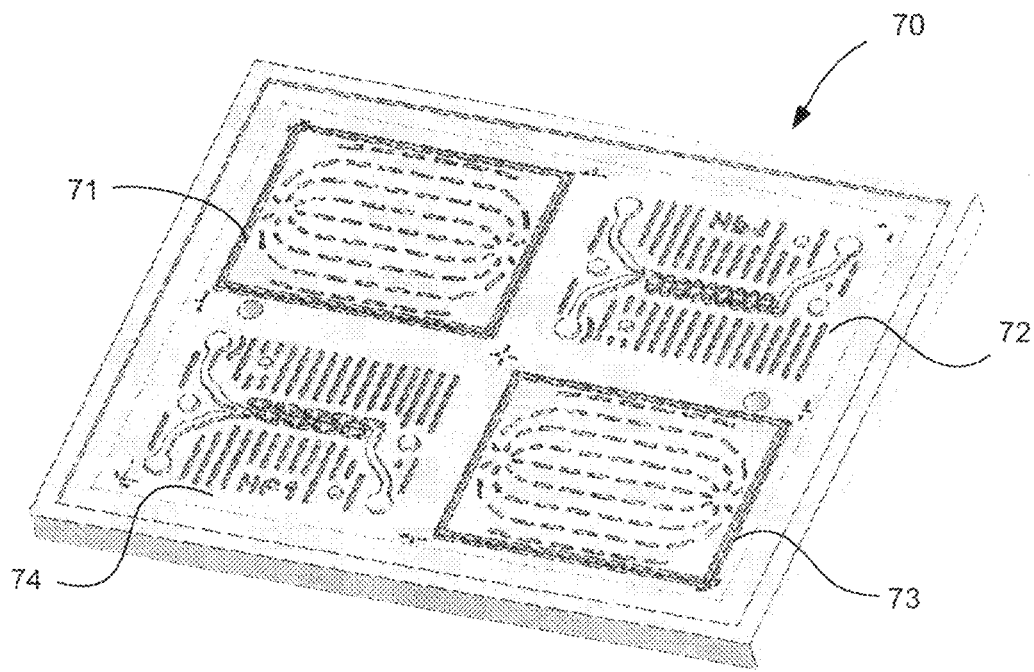
FIG. 7 shows a glass sheet with four molding surface impressions on one side of the sheet.

In another aspect, two or more first or second structures may be disposed on the same surface of the glass-containing composition, wherein the structures comprise identical or different patterned surfaces. In FIG. 7, a formed glass-containing article 70 has been formed by four second structures, with the resulting formed patterns 71 and 73 being the same and the resulting formed patterns 72 and 74 being the same. Depending upon the lateral extent of the particular amount of glass-containing composition and the one or more structures used to pattern it, it is possible to place several structures, each with a molding surface, side-by-side on the surface of the glass-containing composition and subject the resulting stack to thermal processing.

The techniques described above are also useful in making a plurality (i.e., two or more) formed glass-containing articles simultaneously. In one aspect, the method comprises:

providing a first structure having a first surface;

providing a second structure having a second surface and a surface opposite the second surface, said second surface being patterned and porous;

disposing between said first surface and said second surface a first amount of a composition comprising a glass;

providing a third structure having a third surface, disposing between said third surface and the surface opposite said second surface a second amount of a composition comprising a glass, one of the opposite surface and the third surface being patterned; heating together the first, second, and third structures and the first and second amounts of a composition comprising a glass sufficiently to soften the first and second amounts of a composition comprising a glass such that the first and second structures, and the second and third structures, under gravity or an otherwise applied force, move toward each other, such that the first amount of the composition forms a first formed article and the second amount of the composition forms a second formed article patterned by the respective patterned surfaces.

Figure 8:
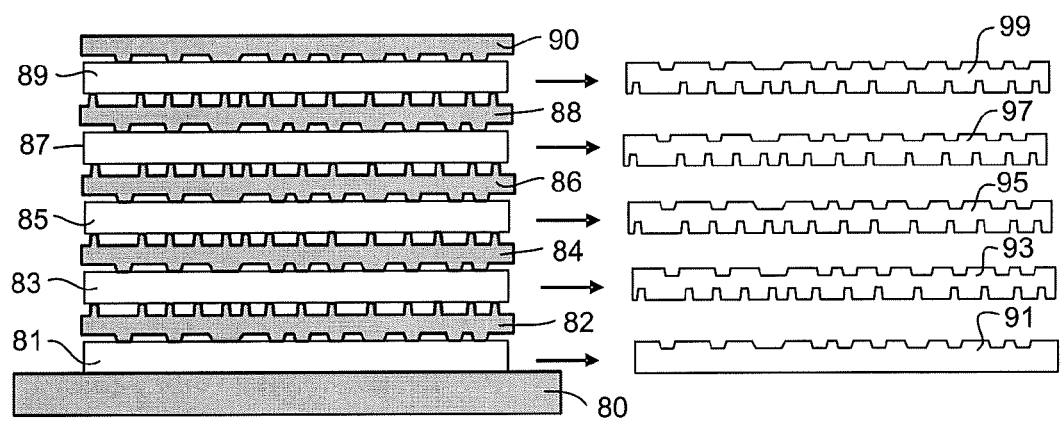
FIG. 8 shows a stacked system composed of multiple amounts of a composition comprising glass disposed between respective multiple structures having patterned surfaces.

Referring to FIG. 8, amounts of glass-containing composition 81, 83, 85, 87, and 89 are disposed or sandwiched between the structure 80 and structures 82, 84, 86, 88, and 90. In the case of structures 82, 84, 86, and 88, there are different patterned surfaces of the structure. Thus, a plurality of formed glass-containing articles can be produced from one stack system. As shown in FIG. 8, five formed articles 91-95 are produced after thermal processing and removal of the formed articles. As described above, it is possible to produce a large number of formed articles in a short period of time. Although structures 82, 84, 86, and 88 each have the same two patterned surfaces, it is contemplated that structures having more than two different surfaces can be stacked to produce a plurality of different formed articles simultaneously.

The formed glass-containing articles produced by the methods described herein are useful in the production of microfluidic devices such as microreactors. Multiple formed articles having cooperating facing structures can be stacked and sealed. In one aspect, the stacked formed articles can be sealed at elevated temperature in air. The temperature and duration of heating will vary depending upon the material used to make the formed articles. The duration of heating is long enough to ensure that a complete seal is formed between each of the contacting formed articles. In the case of microreactors, this is important so that no reactants leak from the system as well as to maintain internal pressure within the microreactor.

Because both sides of the formed articles can be structured, and structured to some degree independently of the other, this method minimizes the number of glass components needed to make a glass microfluidic device or microreactor, particularly a glass microreactor with multiple layers.

In other aspects, it may be desirable to attach a formed glass-containing article to a substrate that is not glass. For example, a formed glass-containing sheet sealed to a high thermal conductivity substrate can improve heat transfer of the resulting microreactor. In one aspect, the material used for the substrate has a CTE similar to that of the glass-containing composition to be formed and can withstand the processing temperature. Examples of substrates useful herein include, but are not limited to, silicon or silicon carbide. In one aspect, the method for attaching a glass mold on a substrate, comprises:

providing a first structure having a first surface;
providing a second structure having a second surface, said second surface being patterned and porous;
disposing between said first surface and said second surface a first amount of a composition comprising a glass;
heating together the first and second structures and the first amount of the composition sufficiently to soften the first amount of the composition such that the first and second structures, under gravity or an otherwise applied force, move toward each other, such that the pattern of the second surface is formed into the first amount of the composition;
wherein the step of heating includes fusing said first amount of the composition comprising glass to said first surface, resulting in the first amount of a composition comprising a glass forming, together with the first structure, a formed glass-containing article.

EXAMPLES

Fabrication of Molding Surface(s)

Figure 9:
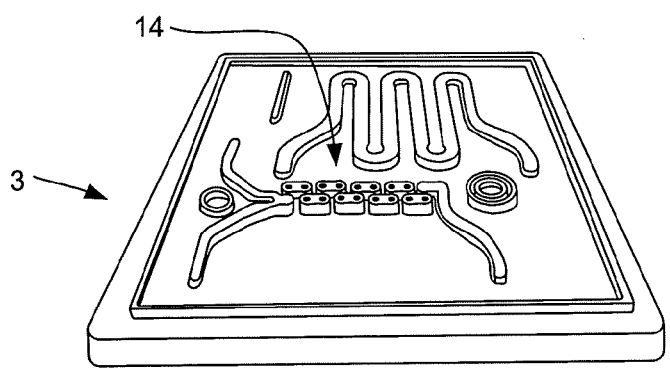
FIG. 9 is a perspective view of a porous graphite structure illustrative of certain embodiments of the present invention.

Fabrication of a molding surface such as that shown in FIG. 9, for example, was achieved by CNC machining from a piece of graphite block (grade C25 manufactured by Carbone Lorraine 41, rue Jean Jaures-Gennevilliers, FRANCE). This grade has a thermal expansion of $33\times10^{-7}/°$ C. at 300° C. and an open porosity level of about 10%, which allows gas to escape the glass during processing and prevent bubble formation. The molding surface design in FIG. 9 is representative of structures used in microreactors. Here, feature heights of the mold vary from 100 µm to 1.5 mm and widths vary from 100 µm to 7 mm. Referring to FIG. 9, the mold has a serpentine structure (height=1 mm, width=4 mm), a multipart structure that corresponds to the mixer zone, and some pillars of various aspect ratio and concentric circles.

Preparation of Molded Glass Sheet

Referring to FIG. 1, the second structure 3 having a patterned second surface 14 as shown in FIG. 9 was placed on a glass-containing composition 2 in the form of a sheet of Borofloat™ glass. The glass sheet is supported by the first surface 12 of a first structure 1. The first and second structures are both formed of carbon. A load 4 in the form of a metal weight machined from NS30 refractory metal was placed on top of the second structure 3 to increase the rate of penetration of the features or areas of the patterned surface 14 into glass during heating. The mass and diameter of the weight were 1.5 kg and 100 mm. One particular value of the present process is that large pressures are not require, such that a gravity and a simple weight can provide good results. In particular, it is desirable that the pressure between the molding surface and the glass-containing composition be less than 100 kPa, desirably less than 10 or even 1.

Figure 10:
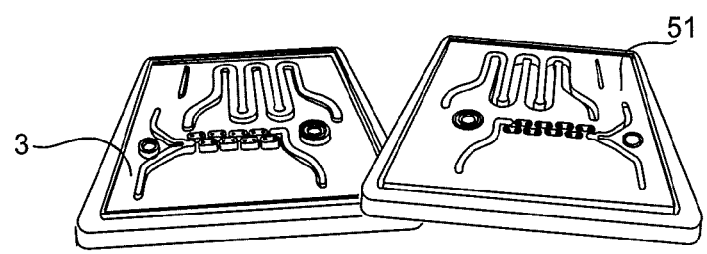
FIG. 10 is a perspective view of a porous graphite structure and a formed glass sheet produced from the mold.
Figure 14:
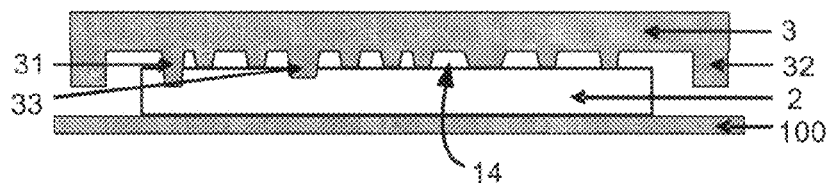
FIG. 14 shows a cross-section of a composition comprising glass disposed between a molding surface and a second surface, the second surface comprising a surface of a substrate 100 to which the glass composition will be adhered.
Figure 15:
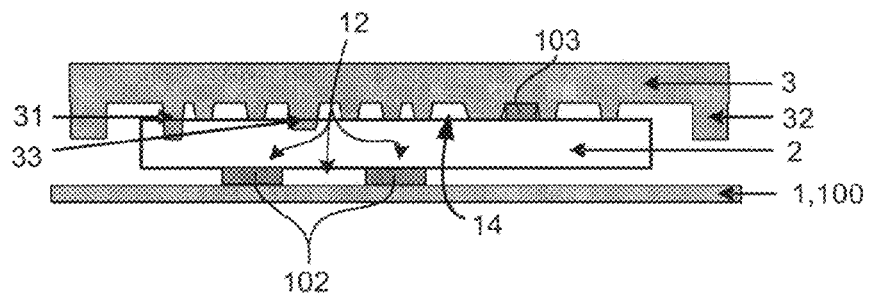
FIG. 15 shows a cross-section of a composition comprising glass disposed between a molding surface and a second surface, the second surface comprising a surface of a substrate 100 to which the glass composition will be adhered or a surface of a structure comprising a rigid, non-stick material, wherein one or more mold inserts 102, 103 are positioned on or in the surfaces 12, 14.
Figure 16:
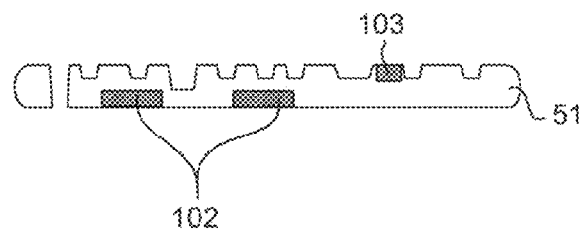
FIG. 16 shows a cross-section of a formed article 51 having one or more inserts 102, 103 incorporated therein.
Figure 17:
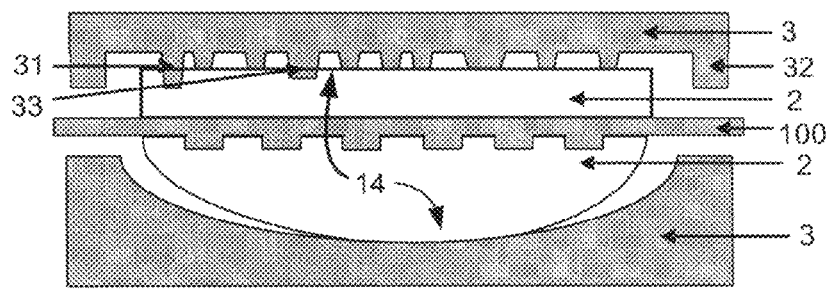
FIG. 17 shows a cross section of a two amounts of compositions comprising glass each disposed between a respective molding surface and a second surface, the second surface comprising a surface of a substrate 100 to which the glass composition will be adhered.

The stacked assembly 10 is loaded into an oven and heated under nitrogen flowing. Prior to introducing nitrogen, air in the oven was removed by vacuum. The temperature of the furnace was increased up to 900° C. over two hours to induce viscous deformation of the glass sheet into the recesses of the surface 14. There was a one-hour dwell followed by cooling down to room temperature over five hours. The first and second structures and the formed glass sheet were disassembled by hand. FIGS. 10 and 11 show the formed Borofloat glass sheet (3.5 mm thick) formed by the procedure described above. All features of the molding surface, even the most intricate features, were perfectly replicated on the surface of the glass. Moreover, as may be seen from the Figure, even mold machining defects on the mold caused by the action of tool of the CNC equipment were impressed onto the surface of glass sheet.

What is claimed:

1. A method for forming a glass-containing microfluidic device having at least one fluid passage therethrough, the method comprising:
   providing a piece of rigid, non-stick material consisting of a porous carbon block having an open porosity of at least 5%, the porous carbon block having a patterned molding surface formed on at least one surface thereof, the patterned molding surface having open porosity and including at least one of a grooved structure and a raised structure;
   providing a first amount of glass-containing composition selected from the group consisting of a vitreous glass, a glass-ceramic, and a filled glass frit consisting of a glass frit and a filler;
   contacting the first amount of glass-containing composition with the patterned molding surface;
   pressing the patterned molding surface and the first amount of glass-containing composition together;
   heating the piece of rigid non-stick material and the first amount of glass-containing composition together sufficiently to soften the amount glass-containing composition such that the patterned molding surface is replicated in the first amount of glass-containing composition, the first amount of glass-containing composition forming a first formed glass-containing article;
   stacking the first formed glass-containing article with at least two additional glass-containing articles;
   sealing the stacked articles together by heat treatment to create a microfluidic device having at least one fluidic passage therethrough.

2. The method as claimed in claim 1 wherein the porous carbon block comprises porous carbon with an open porosity of at least 10%.

3. The method as claimed in either of claims 1 and 2 wherein the step of heating further comprises heating in an inert atmosphere.

4. The method as claimed in claim 3 wherein the step of heating further comprises heating in an atmosphere at ambient pressure or slightly higher as necessary to maintain an inert atmosphere without vacuum.

5. The method as claimed in claim 1 wherein the step of heating further comprises heating in a reduced pressure atmosphere or vacuum.

6. The method as claimed in claim 1 wherein the step of heating further comprises the first amount of glass-containing composition forming a first formed glass-containing article having at least one through-hole.

7. The method of claim 1 wherein the step of pressing comprises applying a pressure of less than 100 kilopascal at the patterned molding surface.

8. The method of claim 1 wherein the glass-containing composition is a vitreous glass.

9. The method of claim 1 wherein the glass-containing composition is a glass-ceramic.

10. The method of claim 1 wherein the glass-containing composition is a filled glass.

11. The method of claim 1 wherein the glass containing material is in the form of a sheet.

12. The method of claim 1 wherein the glass containing material is in the form of a frit.

* * * * *